United States Patent
Shiraiwa

(10) Patent No.: US 11,037,811 B2
(45) Date of Patent: Jun. 15, 2021

(54) ELECTROSTATIC CHUCK AND SEMICONDUCTOR/LIQUID CRYSTAL MANUFACTURING EQUIPMENT

(75) Inventor: Norio Shiraiwa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 303 days.

(21) Appl. No.: 13/547,316

(22) Filed: Jul. 12, 2012

(65) Prior Publication Data
US 2013/0048217 A1 Feb. 28, 2013

(30) Foreign Application Priority Data
Aug. 26, 2011 (JP) .............................. JP2011-184285

(51) Int. Cl.
| | |
|---|---|
| H02N 13/00 | (2006.01) |
| H01L 21/306 | (2006.01) |
| H01L 21/683 | (2006.01) |
| H01L 21/687 | (2006.01) |
| H01L 21/67 | (2006.01) |
| H01J 37/32 | (2006.01) |

(52) U.S. Cl.
CPC .... *H01L 21/6831* (2013.01); *H01J 37/32715* (2013.01); *H01J 37/32724* (2013.01); *H01J 37/32733* (2013.01); *H01J 37/32779* (2013.01); *H01J 37/32788* (2013.01); *H01L 21/67109* (2013.01); *H01L 21/68771* (2013.01); *H01L 21/68785* (2013.01)

(58) Field of Classification Search
USPC ................. 118/728–732; 156/345.51–345.55
See application file for complete search history.

(56) References Cited

U.S. PATENT DOCUMENTS

| | | | |
|---|---|---|---|
| 8,124,539 B2 | 2/2012 | Endoh | |
| 2004/0055540 A1* | 3/2004 | Kanno et al. | ................. 118/724 |
| 2004/0261946 A1* | 12/2004 | Endoh et al. | ............ 156/345.15 |
| 2006/0254717 A1* | 11/2006 | Kobayashi | ................ C23F 4/00 |
| | | | 156/345.44 |

(Continued)

FOREIGN PATENT DOCUMENTS

| | | |
|---|---|---|
| JP | 2005-64460 A1 | 3/2005 |
| JP | 2006-319043 A | 11/2006 |

(Continued)

OTHER PUBLICATIONS

Office Action from Japanese Patent Office dated Apr. 7, 2015, with translation.

(Continued)

*Primary Examiner* — Karla A Moore
*Assistant Examiner* — Tiffany Z Nuckols
(74) *Attorney, Agent, or Firm* — Kratz, Quintos & Hanson, LLP

(57) ABSTRACT

An electrostatic chuck includes, a chuck function portion including a plurality of chuck regions on which an attractable object is placed respectively, and a concave surface portion provided in an outer region of the chuck regions, and electrodes arranged in an inner part of the chuck function portion corresponding to the chuck regions and an inner part of the chuck function portion corresponding to the concave surface portion, respectively.

4 Claims, 9 Drawing Sheets

(56) References Cited

U.S. PATENT DOCUMENTS

2009/0255901 A1* 10/2009 Okita et al. ............... 216/67
2012/0006489 A1*  1/2012 Okita ............... H01L 21/67757
                                                   156/345.43

FOREIGN PATENT DOCUMENTS

JP      2010-232250 A    10/2010
JP      2011-114178 A1    6/2011

OTHER PUBLICATIONS

Taiwanese Office Action dated Jan. 6, 2016 in corresponding TW application No. 101124751, with English translation.
Chinese Office Action dated Dec. 28, 2015 in corresponding CN application No. 201210273478.2, with English translation.
Office Action issued for corresponding Chinese Patent Application No. 201210273478.2, dated Sep. 14, 2016, with English translation.
Japanese Office Action for Japanese Application No. 2011-184285 dated Jul. 18, 2017 (16 Sheets, 17 Sheets translation, 33 Sheets total).
Chinese Patent Application No. 201210273478.2: Third Notification of Office Action dated Mar. 24, 2017.
Office Action of Korean Patent Application No. 10-2012-0075809 dated Nov. 13, 2018 (6 pages, 7 pages translation).
Office Action of corresponding Korean Patent Application No. 10-2012-0075809 dated May 22, 2019 (8 pages, 8 pages translation, 16 pages total).

* cited by examiner

ELECTROSTATIC CHUCK AND SEMICONDUCTOR/LIQUID CRYSTAL MANUFACTURING EQUIPMENT

CROSS-REFERENCE TO RELATED APPLICATIONS

This application is based upon and claims the benefit of priority of the prior Japanese Patent Application No. 2011-184285 filed on Aug. 26, 2011, the entire contents of which are incorporated herein by reference.

FIELD

It is related to an electrostatic chuck used in a mechanism for sucking an attractable object such as a wafer for the logic device, the memory device, LED, LD and so on, or the like, and a semiconductor/liquid crystal manufacturing equipment including the same.

BACKGROUND

In the prior art, in the semiconductor manufacturing equipment such as the dry etching equipment, the CVD equipment, etc. used in the semiconductor wafer process, or the like, the electrostatic chuck on which a wafer is electrostatically attracted and placed is provided in order to control a wafer temperature in various processes.

For instance, the dry etching equipment has the electrostatic chuck which is cooled such that a wafer temperature does not rise more than a regulation value by the plasma process. Consequently, the wafer is cooled in such a condition that a wafer temperature is kept uniform at a certain temperature.

The related art is disclosed in Japanese Laid-open Patent Publication No. 2005-64460 and Japanese Laid-open Patent Publication No. 2011-114178.

As explained in the column of preliminary matter described later, there is an electrostatic chuck which has a plurality of chuck regions, and in which a tray for conveying the wafers is arranged on a concave surface portion which is provided to an outer region of the chuck regions. In the case that such electrostatic chuck is applied to the etching equipment, a temperature of the tray rises considerably higher than a temperature of the wafer because the tray is not attracted to the electrostatic chuck.

For this reason, a temperature of the peripheral part of the wafer rises, so that the etching characteristic is varied in the whole of wafer and thus a decrease of yield is caused. Also, the trouble in conveying the wafers easily occurs in the situation that a temperature of the tray becomes high. Therefore, it is necessary to wait for the conveyance of the tray until the tray is cooled. As a result, such problems exist that throughput of the etching process is decreased and also production efficiency becomes worse.

SUMMARY

According to one aspect disclosed hereinafter, there is provided an electrostatic chuck, which includes a chuck function portion including a plurality of chuck regions on which an attractable object is placed respectively, and a concave surface portion provided in an outer region of the chuck regions, and
electrodes arranged in an inner part of the chuck function portion corresponding to the chuck regions and an inner part of the chuck function portion corresponding to the concave surface portion, respectively.

Also, according to another aspect disclosed hereinafter, there is provided a semiconductor/liquid crystal manufacturing equipment, which includes a chamber, an electrostatic chuck placed to the chamber, and a tray for conveying an attractable object, wherein the electrostatic chuck includes, a chuck function portion including a plurality of chuck regions on which an attractable object is placed respectively, and a concave surface portion provided in an outer region of the chuck regions, and electrodes arranged in an inner part of the chuck function portion corresponding to the chuck regions, and an inner part of the chuck function portion corresponding to the concave surface portion respectively, and the tray includes an opening portion in a part corresponding to the chuck regions, and the tray is arranged on the concave surface portion of the electrostatic chuck.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be explained with reference to the accompanying drawings hereinafter.

Prior to the explanation of embodiments, the preliminary matter to be set forth as a basis will be explained hereunder.

Figure 1:
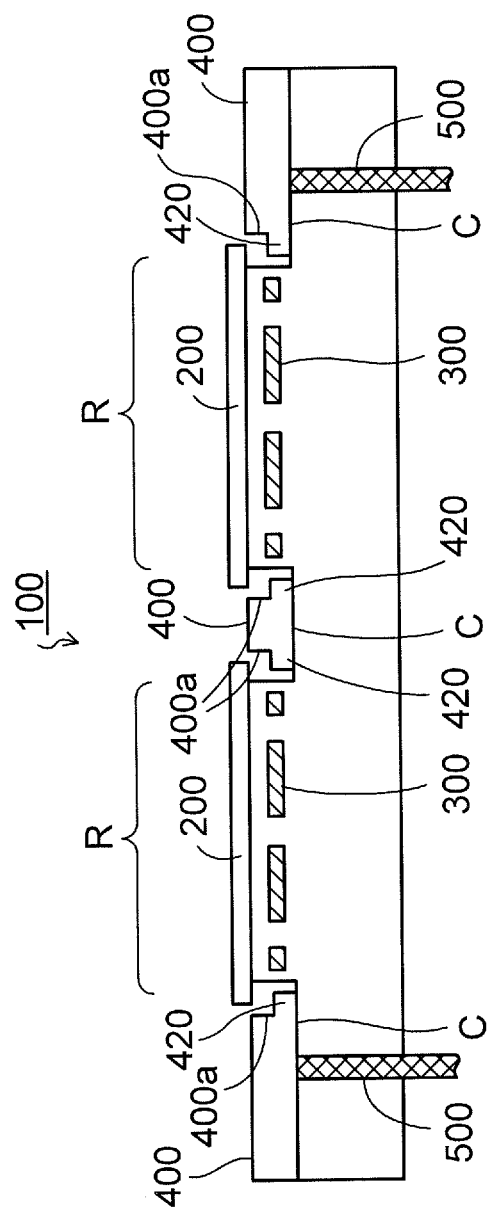
FIG. 1 is a sectional view (#1) explaining a preliminary matter.

As depicted in FIG. 1, an electrostatic chuck 100 includes a plurality of chuck regions R. And a wafer 200 is placed on each chuck region R. Electrodes 300 are provided in an inner part of each chuck region R of the electrostatic chuck 100 respectively.

Also, an outer region of each chuck region R of the electrostatic chuck 100 is formed as a concave surface portion C. Then, an integral-type tray 400 in which an opening portion 400a is provided in the parts corresponding to each chuck region R of the electrostatic chuck 100 respectively, is arranged on the concave surface portion C of the electrostatic chuck 100.

In a lower part in a thickness direction, each of sidewall of each opening portion 400a of the tray 400, a protruding portion 420 having a ring-like shape protruded inward is provided. A plurality of lift pins 500 for moving the tray 400 up and down are arranged like a ring in a peripheral part of the electrostatic chuck 100.

Then, the electrostatic chuck 100 includes a base plate (not shown), in which cooling water channels are provided, on its lower side, and each chuck region R is cooled by flowing a cooling water through the cooling water channels. Then, when the voltage is applied to the electrodes 300 of the electrostatic chuck 100, the wafers 200 are attracted to the electrostatic chuck 100 by an electrostatic attraction.

For example, in the case that the electrostatic chuck 100 is placed to the dry etching equipment, the plasma is generated in a chamber of the dry etching equipment, and a plurality of wafers 200 placed on the electrostatic chuck 100 are etched simultaneously in a state that they are cooled.

Figure 2:
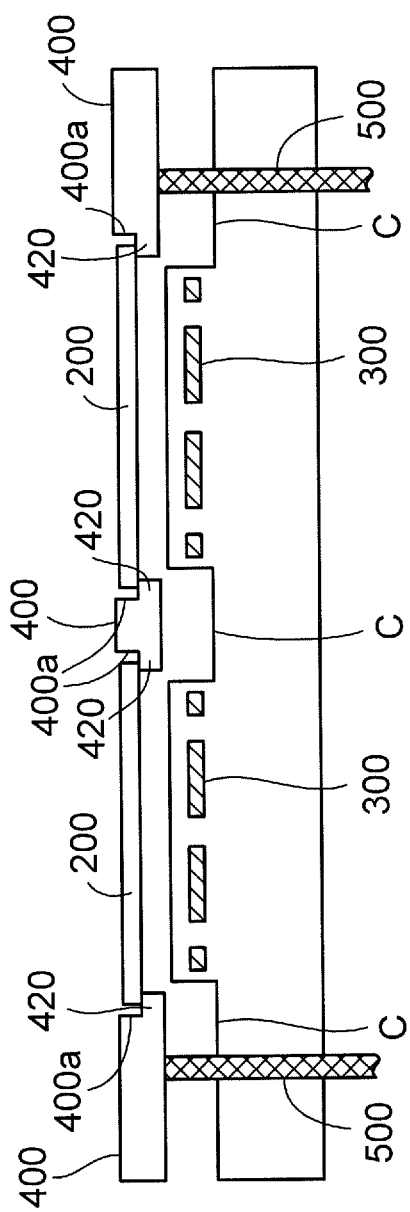
FIG. 2 is a sectional view (#2) explaining the preliminary matter.

As depicted in FIG. 2, when the etching is ended, the lift pins 500 move upward, and thus the tray 400 is moved upward. Then, the peripheral parts of respective wafers 200 are put on the protruding portions 420 of the tray 400, and all wafers 200 are lifted toward the upper side. Then, the tray 400 on which the wafers 200 are loaded is conveyed from the chamber to the outside by an arm (not shown).

When the wafers 200 are etched in the state depicted in FIG. 1, the tray 400 is also exposed to the plasma. At this time, the electrodes 300 of the electrostatic chuck 100 do not exist under the tray 400, and therefore the tray 400 is kept in the condition that the tray is simply put on the electrostatic chuck 100.

Consequently, the tray 400 is not sufficiently cooled. Therefore, the tray 400 absorbs the heat from the plasma and is brought into a high temperature condition. Owing to the influence of the tray 400 whose temperature is increased, a temperature of on the peripheral side of the wafers 200 rises. As a result, uniformity in temperature of respective wafers 200 becomes worse.

Accordingly, the variations of etching rates and selective ratios with respect to the resist or the underlying layer are caused easily in the wafers 200. Therefore, these variations cause such a situation that yield of the etching process of the wafers 200 is decreased.

Also, when a temperature of the tray 400 rises in 100° C. or more, a heat is transferred from the tray 400 to the arm which conveys the tray 400, and thus a thermal expansion of the arm is generated. Due to this thermal expansion, in some cases the trouble in conveying the wafers may be caused.

For this reason, after the etching process is completed, it is necessary to wait for the conveyance of the tray 400 until the tray 400 is cooled. As a result, this delay leads to the decrease of the throughput (wafer processing capacity per unit time) in the etching process, and also production efficiency becomes worse.

Electrostatic chucks according to embodiments explained hereunder can solve the disadvantages mentioned above.

First Embodiment

Figure 3:
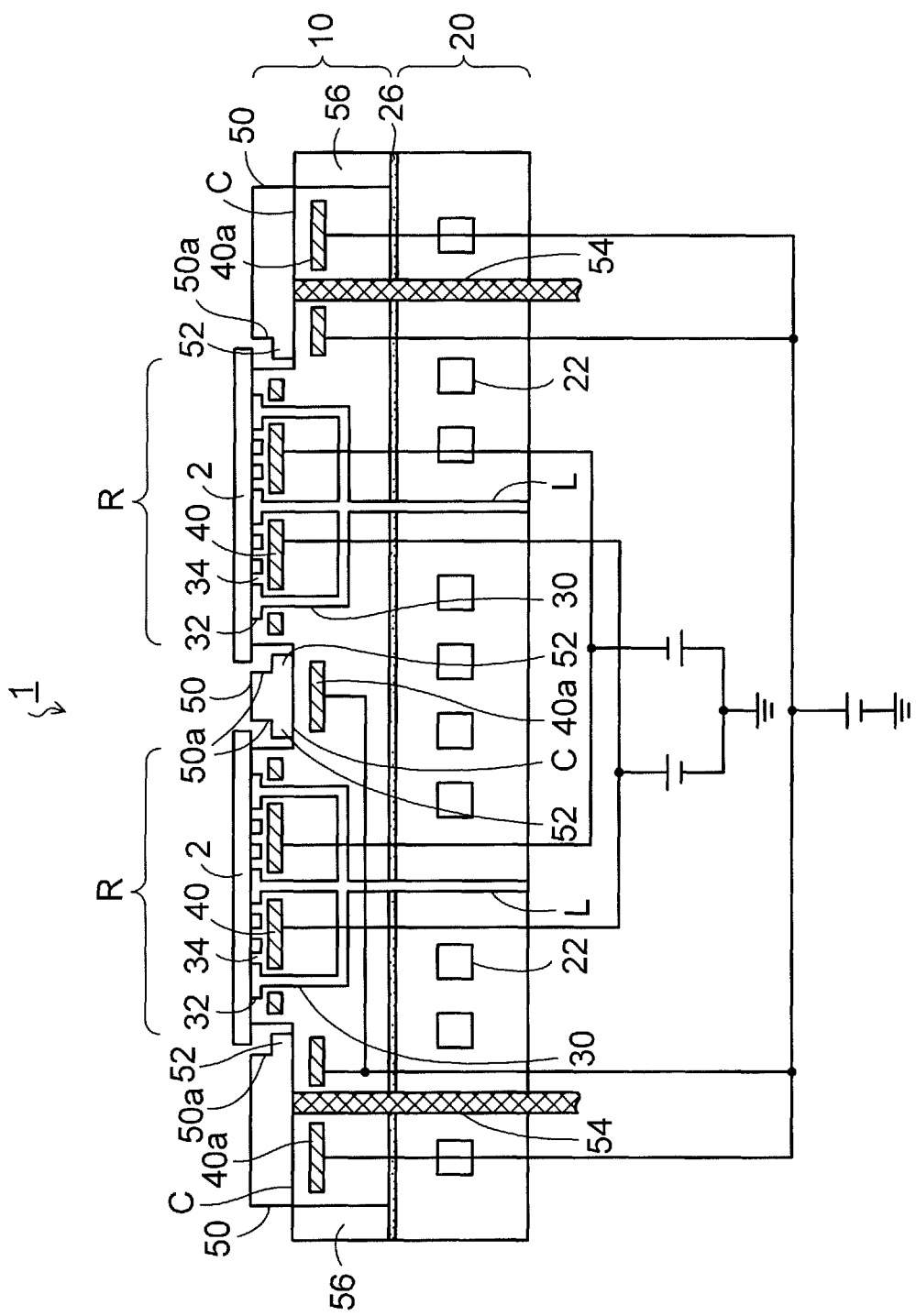
FIG. 3 is a sectional view depicting an electrostatic chuck according to a first embodiment.
Figure 4:
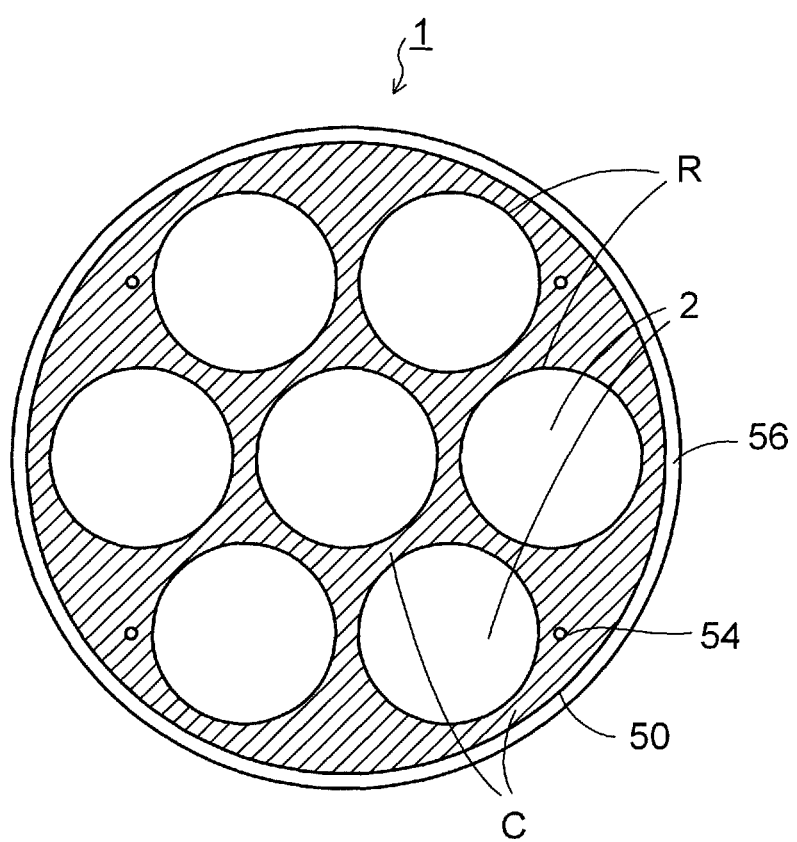
FIG. 4 is a plan view depicting the electrostatic chuck according to the first embodiment.

FIG. 3 is a sectional view depicting an electrostatic chuck according to a first embodiment, and FIG. 4 is a plan view depicting the electrostatic chuck according to the first embodiment.

As depicted in FIG. 3, an electrostatic chuck 1 of the first embodiment includes a base plate 20, and a chuck function portion 10 which is adhered onto the base plate 20 by an adhesive agent 26 such as a silicone resin, or the like.

The base plate 20 is formed of metal such as aluminum, or the like, for example, and cooling water channels 22 are provided in the inner part as a cooling mechanism. The chuck function portion 10 is made of ceramic such as alumina, or the like, for example, and has a plurality of chuck regions R, on which a wafer (an attractable object) is placed respectively, on its surface.

In respective chuck regions R, gas holes 30 for supplying a heat transfer gas and a concave portion 32 extended in the horizontal direction to communicate with the gas holes 30 are provided on the surface. A large number of convex portions 34 are arranged like an island in the concave portion 32. A wafer 2 contacts a large number of convex portions 34 on the surface of each chuck region R of the electrostatic chuck 1, and is placed on them.

In this way, the concave portion 32 formed to communicate with the gas holes 30 and a large number of convex portions 34 are provided on the surface of each chuck region R of the electrostatic chuck 1 to constitute an embossed shape (uneven shape). By this matter, the heat transfer gas is supplied uniformly to the whole back surface of the wafer 2 through the concave portion 32 from the gas route L including the gas holes 30.

Electrodes 40 for attracting the wafer 2 by applying a voltage are provided in the inner part of respective chuck regions R of the electrostatic chuck 1 respectively. Preferably the electrodes 40 is made of a refractory metal such as tungsten (W), or the like.

Also, the chuck function portion 10 of the electrostatic chuck 1 includes a concave surface portion C which is provided in the outer region of each chuck region R. The concave surface portion C is formed to connect from the regions between the chuck regions R to the peripheral regions, except the chuck regions R. A bottom surface of the concave surface portion C is arranged in the position that is lower than an upper surface of the chuck function portion 10.

Also, an integral-type tray 50 in which an opening portion 50a is provided in the parts corresponding to the chuck regions R of the electrostatic chuck 1 respectively, is arranged on the concave surface portion C of the electrostatic chuck 1. In a lower part of in a thickness direction, of each sidewall of the opening portion 50a of the tray 50, ring-like protruding portion 52 protruded inward is provided.

The tray 50 is made of a metal such as alumina ($Al_2O_3$), aluminum nitride (AlN), silicon nitride (SiN), silicon carbide (SiC), aluminum (Al), or the like.

A plurality of lift pins 54 for moving the tray 50 up and down are arranged like a ring on the peripheral part of the electrostatic chuck 1.

Also, a focus ring 56 for confining the plasma in the electrostatic chuck 1 and made of quartz is provided on the outer edge part of the electrostatic chuck 1.

Then, by flowing a refrigerant such as cooling water, or the like into the cooling water channels 22 in the base plate 20 of the electrostatic chuck 1, respective chuck regions R are cooled.

Also, in the electrostatic chuck 1 of the present embodiment, electrodes 40a for attracting the tray 50 by applying a voltage are provided to the inner part of the chuck function portion 10, where is located under the concave surface portion C on which the tray 50 is arranged, so that not only the wafers 2 but also the tray 50 can be cooled sufficiently.

The electrodes 40, 40a may be formed from the single-electrode system having one electrode. Alternatively, the twin electrode system of spiral type, comb-teeth type, or the like may be employed, and a plus (+) voltage and a minus (−) voltage may be applied to the twin electrodes respectively.

In the example in FIG. 3, a plus (+) voltage may be applied to one electrodes 40 used for the wafer 2 in each chuck region R, and a minus (−) voltage may be applied to the other electrodes 40 used for the wafer 2. Also, a plus (+) voltage is applied to the electrodes 40a used for the tray 50.

In this way, the wafer 2 is attracted to the electrostatic chuck 1 by an electrostatic attraction at the time that a predetermined voltage is applied to the electrodes 40, 40a of the electrostatic chuck 1. At the same time, the tray 50 is also attracted to the electrostatic chuck 1.

In FIG. 4, a structure of the electrostatic chuck according to the present embodiment when viewed from the top is depicted. In the example in FIG. 4, seven chuck regions R are provided in the electrostatic chuck 1, and the wafer 2 is placed on each chuck region R. Also, the tray 50 is arranged on the hatched part except a plurality of chuck regions R.

The region on which the tray 50 is arranged is constituted as the concave surface portion C of the chuck function portion 10. The electrodes 40a (FIG. 3) used for the tray 50 are provided in the region located under the hatched part. Also, four lift pins 54 are arranged in the peripheral part of the electrostatic chuck 1, and the focus ring 56 is provided on the outer edge part of the electrostatic chuck 1.

In the case that the electrostatic chuck 1 is placed in the dry etching equipment, the plasma is generated in the chamber, and then a plurality of wafers 2 placed on the electrostatic chuck 1 are etched simultaneously in a state that wafers 2 are cooled.

Figure 5:
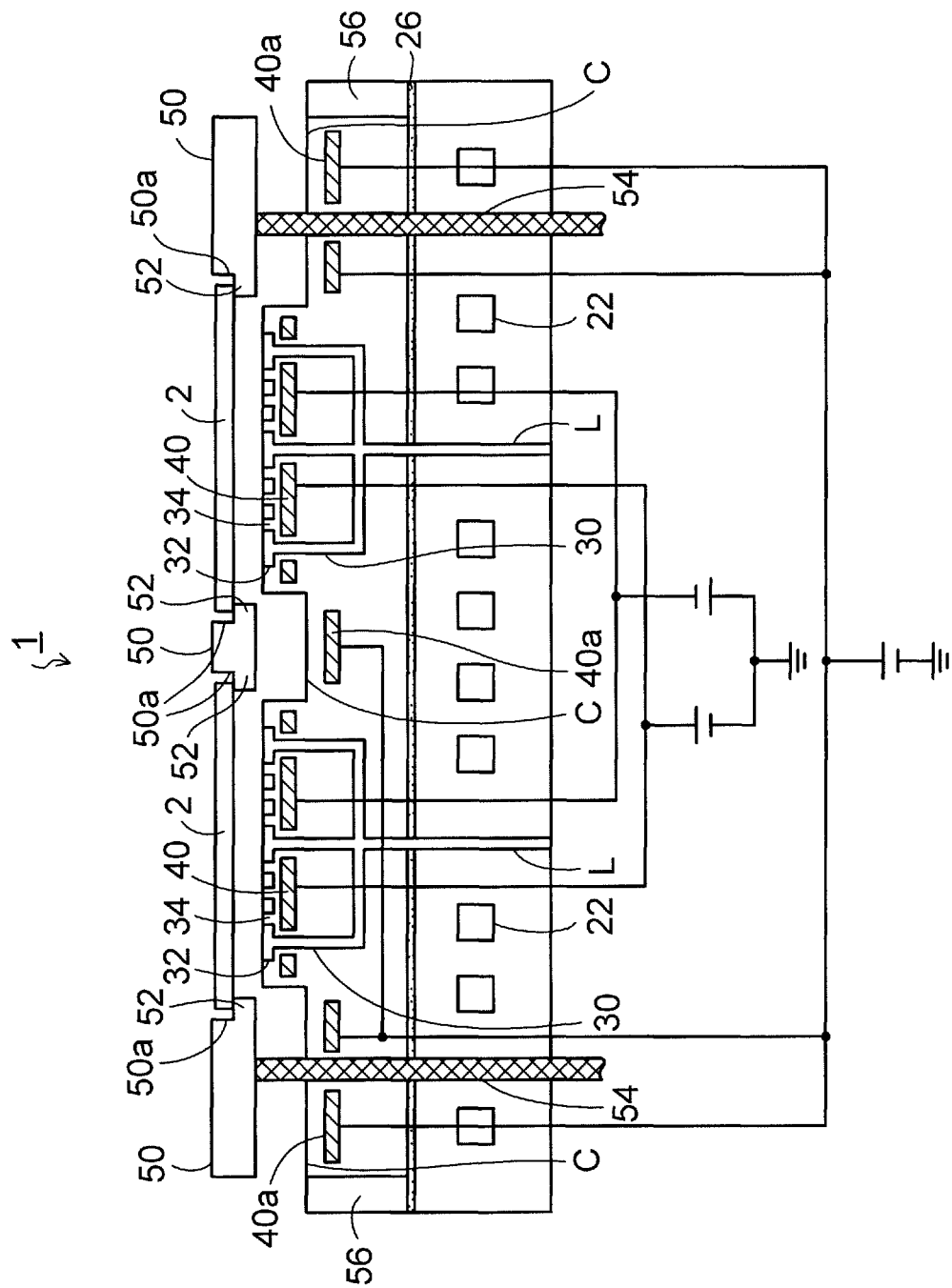
FIG. 5 is a sectional view depicting a state that wafers are lifted upward by a tray in the electrostatic chuck according to the first embodiment.

As depicted in FIG. 5, when the etching is ended, the lift pins 54 move upward, and thus the tray 50 is moved upward. Then the peripheral part of each wafer 2 is put on the protruding portion 52 of the tray 50, and all wafers 2 are lifted toward the upper side. Then, the tray 50 on which the wafers 2 are loaded is conveyed from the chamber to the outside by an arm (not shown).

When the wafers 2 are etched in the above state depicted in FIG. 3, the tray 50 is also exposed to the plasma. In this time, the electrodes 40a used for the tray 50 are provided in the electrostatic chuck 1 located under the tray 50, and therefore such a situation is obtained that the tray is attracted sufficiently to the electrostatic chuck 1.

Consequently, similarly to the wafers 2, the heat supplied to the tray 50 from the plasma is radiated to the outside via the electrostatic chuck 1, and the tray 50 is sufficiently cooled. Accordingly, such a situation can be avoided that a temperature of the peripheral parts of the wafers 2 rises during the etching process, and thus uniformity in temperature can be secured in respective wafers 2.

As a result, the variations of etching rates and selective ratios with respect to the resist or the underlying layer can be suppressed in respective wafers 2, and also yield of the etching process in the respective wafers 2 can be improved.

Also, since the tray 50 is cooled sufficiently by the electrostatic chuck 1, a temperature of the tray 50 can be suppressed in 100° C. or less immediately after the etching process is ended as well. As a result, it is not necessary to wait for the conveyance of the tray 50 until the tray 50 is cooled, and thus the tray 50 can be conveyed by the arm immediately after the etching process is completed.

By this matter, throughput (wafer processing capacity per unit time) of the etching process can be improved, and it can contribute to improvement of production efficiency.

Further, such a risk can be eliminated that the arm is thermally expanded, and thus the tray 50 can be conveyed by the arm with good reliability.

Here, the cooling water channels 22 are provided in the base plate 20 in the above-mentioned electrostatic chuck 1, and the electrostatic chuck 1 itself has the cooling mechanism. However, the electrostatic chuck does not always have the cooling mechanism.

In that case that the electrostatic chuck does not have the cooling mechanism, the cooling mechanism is provided in the supporting tables of various manufacturing equipments to which the electrostatic chuck is placed, and the electrostatic chuck is placed onto the supporting table and is cooled. Above constitution is similar in second and third embodiments explained hereinafter.

Second Embodiment

Figure 6:
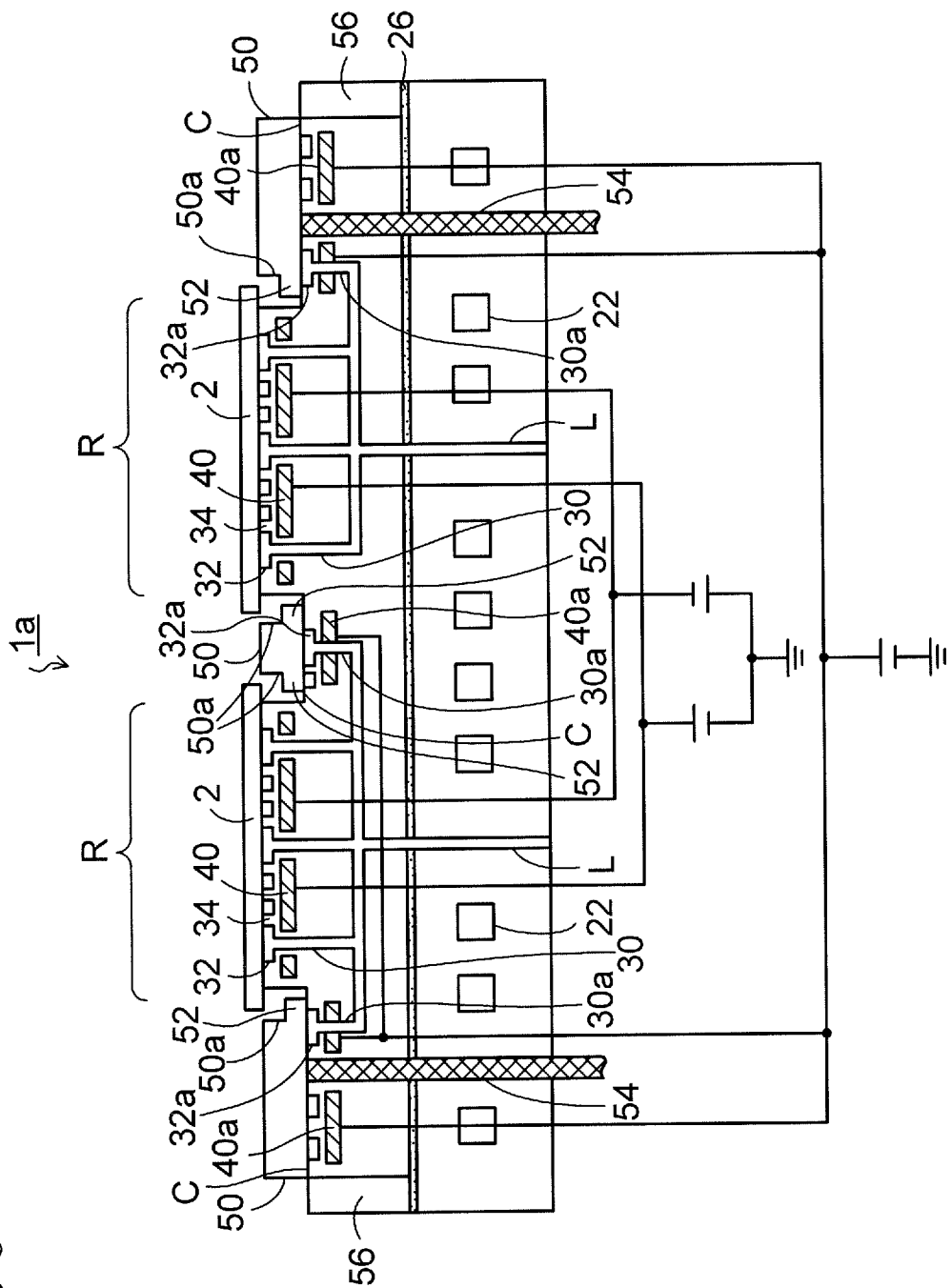
FIG. 6 is a sectional view depicting an electrostatic chuck according to a second embodiment.

FIG. 6 is a sectional view depicting an electrostatic chuck according to a second embodiment.

In the electrostatic chuck 1 of FIG. 3 in the first embodiment as mentioned above, such a structure is employed that the heat transfer gas is not supplied between the tray 50 and the electrostatic chuck 1. A feature of the second embodiment resides in that a heat transfer gas is supplied between the tray and the electrostatic chuck to improve a cooling efficiency. In FIG. 6, the same reference symbols are affixed to the same constituent elements as those of the first embodiment, and their detailed explanation will be omitted hereunder.

As depicted in FIG. 6, in an electrostatic chuck 1a of the second embodiment, a gas hole 30a for supplying a heat transfer gas and a concave portion 32a formed to communicate with the gas hole 30a are also provided on the surface of the concave surface portion C on which the tray 50 is arranged. The gas hole 30a in the concave surface portion C is provided as a branch line which is connected to the gas holes 30 in the chuck regions R.

A heat transfer gas such as a helium gas, or the like is supplied from the gas routes L including the gas holes 30, 30a to the concave portions 32, 32a which are communicated with the gas holes 30, 30a. Thereby, the heat transfer gas can be supplied simultaneously to the respective back surfaces of the wafers 2 and the tray 50 respectively.

By this matter, similarly to the wafer 2, a heat of the tray 50, which is absorbed from the plasma, can be released efficiently to the electrostatic chuck 1a side via the heat transfer gas, and the tray 50 can be cooled effectively. As a result, even in the case that the high-density plasma is used in order to attain the micro-fabrication, the tray 50 can be cooled sufficiently.

Third Embodiment

Figure 7:
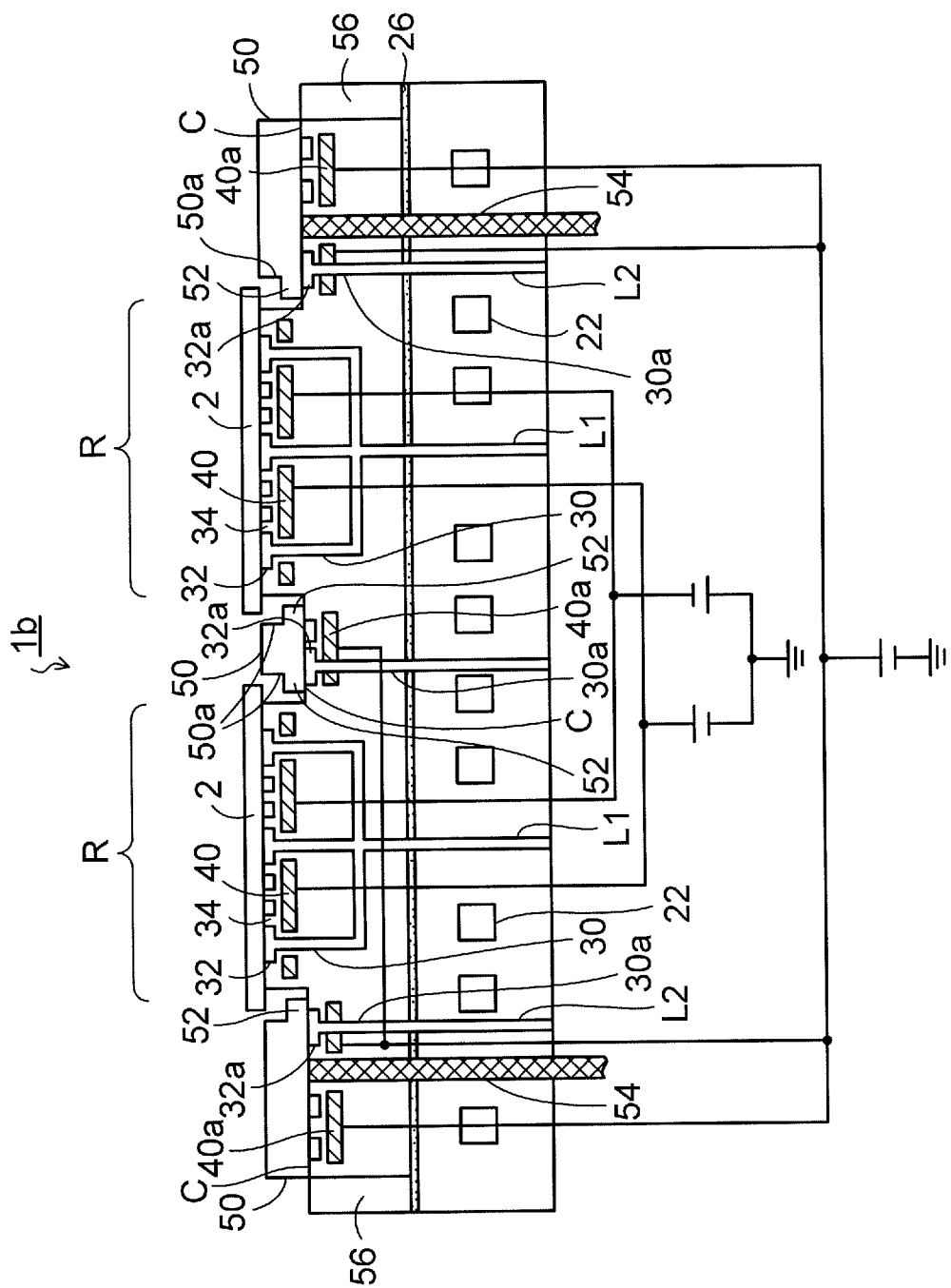
FIG. 7 is a sectional view depicting an electrostatic chuck according to a third embodiment.

FIG. 7 is a sectional view depicting an electrostatic chuck according to a third embodiment. In FIG. 7, the same reference symbols are affixed to the same constituent elements as those of the first embodiment, and their detailed explanation will be omitted hereunder.

Like an electrostatic chuck 1b depicted in FIG. 7, gas routes L1 including the gas holes 30 for supplying a heat transfer gas to the wafer 2, and gas routes L2 including the gas hole 30a for supplying a heat transfer gas to the tray 50 may be separated, and may be provided as independent separate lines.

By doing like this, flow rates and gas pressures of the heat transfer gases can be controlled independently between the wafers 2 and the tray 50. Therefore, a cooling efficiency can be changed between the wafers 2 and the tray 50. For example, this electrostatic chuck can easily respond to the case that the tray 50 needs to be cooled more positively than the wafers 2, or the like, depending on the circumstances in the etching characteristics, the stabilization of the conveyance, or the like.

Fourth Embodiment

Figure 8:
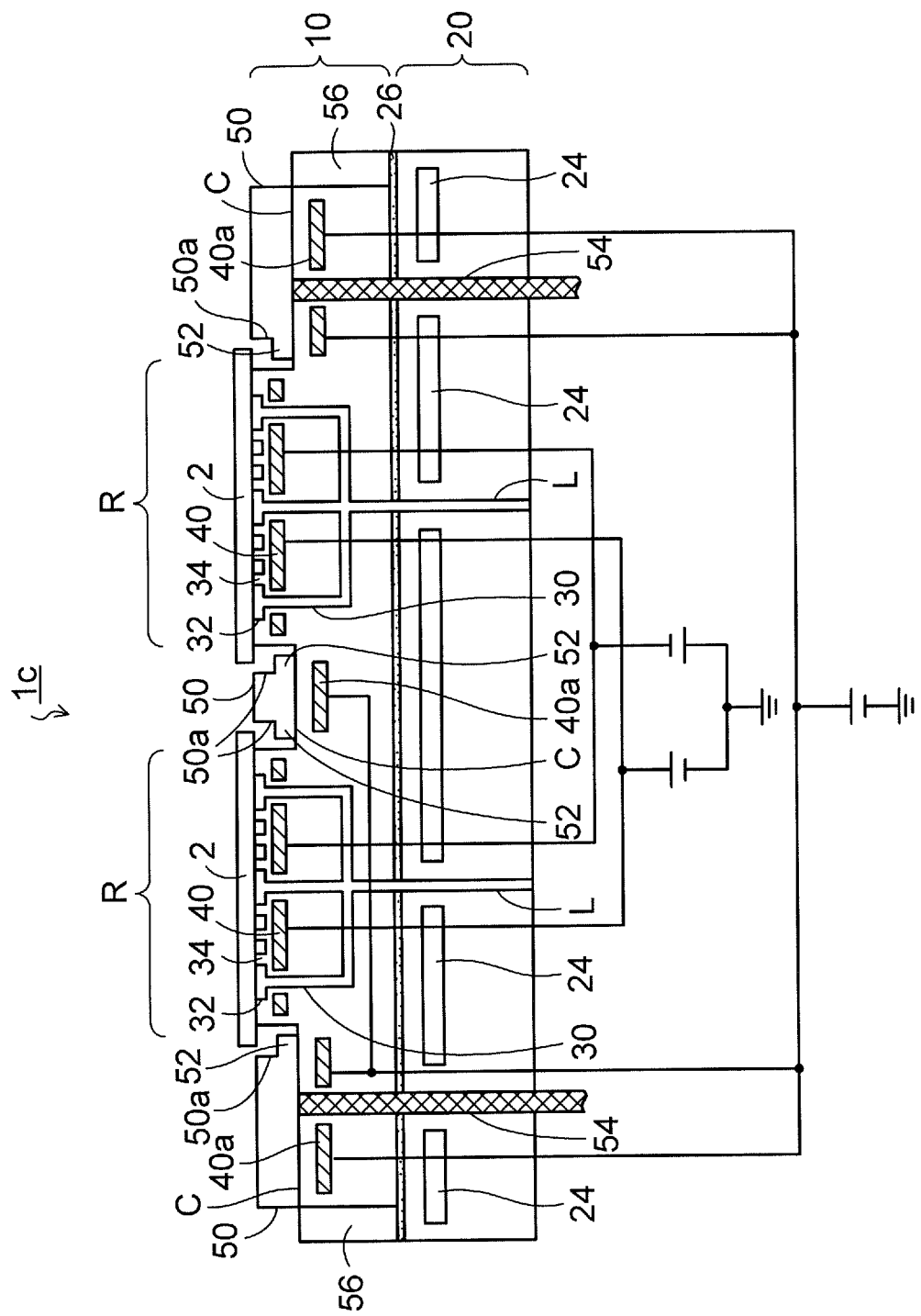
FIG. 8 is a sectional view depicting an electrostatic chuck according to a fourth embodiment.

In the first to third embodiments mentioned above, the electrostatic chuck of the type used to cool the wafer is explained. In that case, the heat transfer gas functions as a cooling gas. As depicted in FIG. 8, heater electrodes 24 may be provided in the inner part of the base plate 20 as a heating mechanism instead of the cooling water channels 22, thereby an electrostatic chuck 1c of the type to heat the wafer may be obtained.

In this case, the heat transfer gas functions as a heating gas. A voltage is applied to the heater electrodes 24 from a power supply (not shown), thereby a heat is generated from the heater electrodes 24. Thus, the wafers 2 and the tray 50 are heated up to a predetermined temperature. The electrostatic chuck 1c of the type to heat the wafers is applied to the semiconductor/liquid crystal manufacturing equipment such as the sputter equipment, the plasma CVD equipment, or the like.

In FIG. 8, except that the heater electrodes 24 are provided in the inner part of the base plate instead of the cooling water channels 22, the electrostatic chuck 1c is the same as the electrostatic chuck 1 of FIG. 3 in the first embodiment.

In the case that the electrostatic chuck 1c of the type to heat the wafer is used, since the wafers 2 as well as the tray 50 are attracted on the electrostatic chuck 1c, the wafers 2 and the tray 50 located in the periphery of the wafers 2 are heated at the same temperature. As a result, also in the case that the wafers 2 are heated, the uniformity of temperature in the wafer 2 can be improved, and the reliability of various processes can be improved.

Here, the heater electrodes 24 may not be provided in the electrostatic chuck 1c. In this case, the heating mechanism is provided in the supporting table of various manufacturing equipments, to which the electrostatic chuck 1c is placed, thereby the electrostatic chuck may be heated by it.

Also, in the case that electrostatic chuck of the high-temperature type, in which the wafer is heated in 100° C. or more, is employed, it is preferable that, in order to avoid the trouble in conveying the wafers, the special arm having enough heat resistance against a heating temperature should be used as the arm used to convey the tray 50.

Semiconductor/Liquid Crystal Manufacturing Equipment

Next, a semiconductor/liquid crystal manufacturing equipment including the electrostatic chuck according to the present embodiments will be explained hereunder. The electrostatic chuck 1, 1a, 1b, or 1c of the present embodiment can be applied to various semiconductor/liquid crystal manufacturing equipments which are used in manufacturing processes of a semiconductor device or a liquid crystal display device.

In the following explanation, a dry etching equipment including the electrostatic chuck 1 which is cooled in the first embodiment is enumerated as an example to give explanation.

Figure 9:
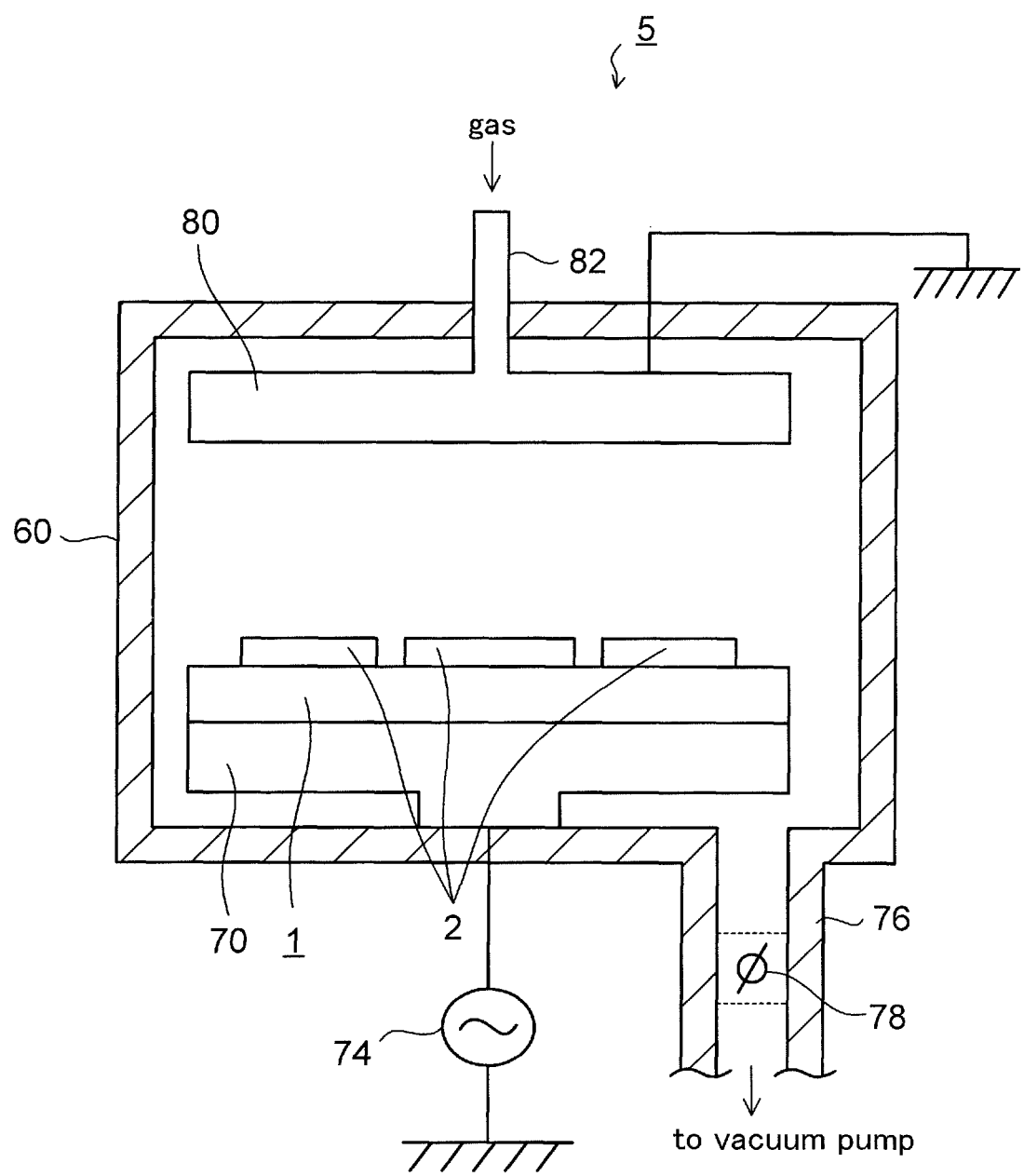
FIG. 9 is a sectional view depicting a dry etching equipment (a semiconductor/liquid crystal manufacturing equipment) including the electrostatic chuck according to the embodiment.

FIG. 9 is a sectional view depicting the dry etching equipment according to the present embodiment. As depicted in FIG. 9, a parallel-plate type RIE equipment is illustrated as a dry etching equipment 5. The dry etching equipment 5 includes a chamber 60, and a lower electrode 70 is arranged to lower side in the chamber 60.

The above electrostatic chuck 1 of the first embodiment is placed onto the surface side of the lower electrode 70, and a plurality of wafers 2 (attractable objects) are placed on the electrostatic chuck 1.

A high-frequency power supply 74 for applying an RF power is connected to the lower electrode 70 and the electrostatic chuck 1. An RF matcher (not shown) for performing the matching of the output of the RF power is connected to the high-frequency power supply 74.

An upper electrode 80 functioning as an opposing electrode of the lower electrode 70 is arranged to the upper side in the chamber 60, and this upper electrode 80 is grounded. A gas introducing pipe 82 is coupled to the upper electrode 80, and a predetermined etching gas is introduced into the chamber 60.

An exhaust pipe 76 is connected to the lower part of the chamber 60, and a vacuum pump is fitted to the end of the exhaust pipe 76. By this matter, a reaction product produced by the etching, or the like are exhausted to the outside (the exhaust gas treatment equipment) through the exhaust pipe 76.

An APC valve 78 (Auto Pressure Control valve) is provided to the exhaust pipe 76 adjacent to the chamber 60. An opening degree of the APC valve 78 is automatically controlled such that an interior of the chamber 60 is kept at a setting pressure.

In the dry etching equipment 5 of the present embodiment, a predetermined etching gas is introduced into the chamber 60 from gas introducing pipe 82, and an interior of the chamber 60 is set at a predetermined pressure by the function of the APC valve 78. Then, an RF power is applied to the electrostatic chuck 1 (the lower electrode 70) from the high-frequency power supply 74, and thus the plasma is generated in the interior of the chamber 60.

A negative self-bias is formed on the electrostatic chuck 1 side by applying the RF power to the electrostatic chuck 1. As a result, positive ions in the plasma are accelerated toward the electrostatic chuck 1 side. On the basis of this, an etched layer formed on the wafer 2 is etched anisotropically.

As the wafer 2, in the case that the LEDs are manufactured, a sapphire substrate, a silicon carbide (SiC) substrate, a gallium nitride (GaN) substrate, or the like is used. Then, various thin films formed on the wafer 2 are etched while using the resist as a mask. As the process gas, a fluorine-based gas or a chlorine-based gas is used.

As mentioned above, in the electrostatic chuck 1 of the present embodiment (FIG. 3, etc.), the electrodes 40a are provided in the electrostatic chuck 1 located under the tray 50, and the tray 50 can be attracted on the electrostatic chuck 1. By this matter, the tray 50 can be cooled sufficiently like the wafer 2.

Accordingly, such a situation can be avoided that a temperature is varied in the wafer 2 due to a temperature rise of the tray 50, and the arm for conveying the tray 50 is thermally expanded to cause the conveying trouble.

As a result, the variations of etching rates of the etched layer and selective ratios with respect to the resist or the underlying layer can be suppressed in respective wafers 2. By this matter, the variations of the pattern width, or the like in the wafers 2 after the etching can be suppressed, and yield of the etching process in the wafers 2 can be improved.

Also, even when the high-density plasma is used in order to attain the micro-fabrication, a temperature rise of the tray 50 can be suppressed. Therefore, the stable etching characteristics can be achieved.

In FIG. 9, the mode in which the electrostatic chuck 1 of the present embodiment is applied to the dry etching equipment of the parallel plate type is illustrated. However, the electrostatic chuck 1 of the present embodiment may be applied to the dry etching equipment of the inductively coupled plasma (ICP) type, or the like.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. An electrostatic chuck, comprising:
   a chuck function portion including a plurality of chuck regions on which an attractable object is placed respectively, and a concave surface portion provided in an outer region of the chuck regions;
   a focus ring arranged in an outer edge part of the chuck function portion;
   first electrodes arranged in an inner part of the chuck function portion corresponding to the chuck regions;
   second electrodes arranged in an inner part of the chuck function portion corresponding to the concave surface portion, wherein the focus ring does not overlap the second electrodes in plan view,
   wherein the second electrodes are separated from the first electrodes, and a voltage is applied to the first electrodes and the second electrodes independently;
   gas holes in which a heat transfer gas is supplied and concave portions formed to communicate with the gas holes, the gas holes and the concave portions provided in respective surfaces of the chuck regions and concave surface portion,
   wherein a gas route including the gas holes provided in the surface of the chuck regions, and another gas route including the gas holes provided in the surface of the concave surface portion are provided as separate routes;
   wherein a tray for conveying the attractable object is arranged on the electrostatic chuck, the tray includes opening portions in parts corresponding to the chuck regions, and a peripheral part of the tray contacts the concave surface portion of the chuck function portion, wherein an entire portion of the peripheral part of the tray is located inside the concave surface portion in plan view, and an entire portion of the focus ring is located outside the tray in plan view, and
   a gas flow rate and a gas pressure of the heat transfer gas are controlled independently.

2. An electrostatic chuck according to claim 1, further comprising:
   a base plate arranged under the chuck function portion including a cooling mechanism.

3. A semiconductor/liquid crystal manufacturing equipment, comprising:
   a chamber;
   an electrostatic chuck placed to the chamber; and
   a tray for conveying an attractable object;
   wherein the electrostatic chuck includes
   a chuck function portion including a plurality of chuck regions on which an attractable object is placed respectively, and a concave surface portion provided in an outer region of the chuck regions;
   a focus ring arranged in an outer edge part of the chuck function portion;
   first electrodes arranged in an inner part of the chuck function portion corresponding to the chuck regions;
   second electrodes arranged in an inner part of the chuck function portion corresponding to the concave surface portion, wherein the focus ring does not overlap the second electrodes in plan view,
   wherein the second electrodes are separated from the first electrodes, and a voltage is applied to the first electrodes and the second electrodes independently;
   gas holes in which a heat transfer gas is supplied and concave portions formed to communicate with the gas holes, the gas holes and the concave portions provided in respective surfaces of the chuck regions and concave surface portion,
   wherein a gas route including the gas holes provided in the surface of the chuck regions, and another gas route including the gas holes provided in the surface of the concave surface portion are provided as separate routes;
   wherein the tray includes opening portions in parts corresponding to the chuck regions, and a peripheral part of the tray contacts the concave surface portion of the chuck function portion, wherein an entire portion of the peripheral part of the tray is located inside the concave surface portion in plan view, and an entire portion of the focus ring is located outside the tray in plan view, and
   a gas flow rate and a gas pressure of the heat transfer are controlled independently.

4. A semiconductor/liquid crystal manufacturing equipment according to claim 3, wherein the electrostatic chuck further includes a base plate arranged under the chuck function portion including a cooling mechanism, and
   the semiconductor/liquid crystal manufacturing equipment is a dry etching equipment.

* * * * *